(12) United States Patent
Vetro et al.

(10) Patent No.: US 7,876,257 B2
(45) Date of Patent: Jan. 25, 2011

(54) METHOD AND APPARATUS FOR COMPRESSING SAR SIGNALS

(75) Inventors: Anthony Vetro, Arlington, MA (US); Shan Liu, Cambridge, MA (US); Jian Lou, Seattle, WA (US); Stephen R. Burgess, Walpole, MA (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 352 days.

(21) Appl. No.: 12/110,834

(22) Filed: Apr. 28, 2008

(65) Prior Publication Data

US 2009/0267825 A1 Oct. 29, 2009

(51) Int. Cl.
*G01S 13/90* (2006.01)

(52) U.S. Cl. .................. 342/25 F; 342/25 R; 342/179; 342/197

(58) Field of Classification Search ............... 342/25 F
See application file for complete search history.

(56) References Cited

U.S. PATENT DOCUMENTS

| 4,801,939 | A  | * | 1/1989  | Jones ...................... 342/25 A |
| 5,661,477 | A  |   | 8/1997  | Moreira et al. |
| 5,666,121 | A  | * | 9/1997  | Fang et al. ................. 342/25 A |
| 6,658,159 | B1 | * | 12/2003 | Taubman .................... 382/240 |
| 6,674,910 | B1 | * | 1/2004  | Moon et al. ................. 382/239 |
| 7,099,387 | B2 | * | 8/2006  | Bjontegaard et al. ........ 375/240 |

OTHER PUBLICATIONS

Benz et al. "A Comparison of Several Algorithms for SAR Raw Data Compression." IEEE Transactions on Geoscience and Remote Sensing. vol. 33, Issue 5. Sep. 1995. pp. 1266-1276.*

Ronald Kwok "Block Adaptive Quantization of Magellan SAR Data," IEEE Trans on Geoscience and Remote Sensing, vol. 27, No. 4, pp. 375-383, Jul. 1989.

Edward J. Delp et al., "Image Compression Using Block Truncation Coding (BTC)", IEEE Transactions Communications, vol. Com-27, No. 9, Sep. 1979.

Enrico Magli et al., "Wavelet-based compression of SAR raw data," Geoscience and Remote Sensing Symposium, 2002, IEEE International, pp. 1129-1131.

"Frequency domain in raw SAR data compression for multi-mode SAR Instruments," National Aerospace Laboratory (NLR), EUSAR 2006, 6th European Conference on Synthetic Aperture, May 16-18, 2006, Dresden.

* cited by examiner

*Primary Examiner*—Thomas H Tarcza
*Assistant Examiner*—Matthew M Barker
(74) *Attorney, Agent, or Firm*—Dirk Brinkman; Gene Vinokur

(57) ABSTRACT

A method compresses synthetic aperture radar (SAR) data by sampling the SAR data into blocks and transforming each block to a corresponding block of transform coefficients. Each block of transform coefficient is quantized according to a quantization parameter to obtain a corresponding block of quantized transform coefficients, which are demultiplexed into sets of blocks of quantized transform coefficients. The quantized transform coefficients in the blocks in each set are arithmetically encoding in parallel according to a probability model to produce an intermediate bitstream for each set of blocks. The encoding of the quantized transform coefficients of one block is independent of the quantized transform coefficients of a successive block. The intermediate of bitstreams are then multiplexed to a compressed bitstream, which can be transmitted, or stored, for subsequent decoding to construct an SAR image.

36 Claims, 11 Drawing Sheets

300

400

| Target bit rate (bits per pixel) | Target compression ratio (Uncompressed : Target) bit rate | average QP |
|---|---|---|
| 4 | 8 : 4 (1 : 50%) | 4 |
| 3 | 8 : 3 (1 : 37.5%) | 7 |
| 2 | 8 : 2 (1 : 25%) | 12 |
| ... | ... | ... |

500
*FIG. 5*

METHOD AND APPARATUS FOR COMPRESSING SAR SIGNALS

FIELD OF THE INVENTION

The invention relates generally to compressing signals acquired by synthetic aperture radar (SAR), and more particularly to compressing raw SAR signals in low complexity devices.

BACKGROUND OF THE INVENTION

Synthetic aperture radar (SAR) acquires raw radar data from target objects or terrain typically using a space-based platform. Post-processing converts the raw SAR data to an amplitude image and phase maps, such that objects and terrain can be visualized. Due to the very high computational complexity, the SAR data processing is typically performed on the ground.

FIG. 1 shows a conventional SAR system. Raw SAR data 101 are acquired by a space-based platform 110, e.g., a satellite, space station or shuttle. The raw data are transmitted 110 to a ground station for post-processing 120 to obtain a SAR image 130.

Alternatively as shown in FIG. 2, compression 151 is applied to the raw SAR data 101 before transmission 120. Then, the compressed raw data are transmitted to the ground station, where the data are decompressed 152 and processed 120 to produce the SAR image 130. A high coding efficiency is required to reduce the bandwidth of transmission, while at the same time enabling a high quality reconstruction of the SAR image 130 from the compressed data.

It is known that standardized image compression methods, such as JPEG, are not suited for achieving high coding efficiency of raw SAR data. The main reason is due to the noisy nature of the raw SAR data, which is not well matched with the JPEG coding standard that has been optimized for coding natural images. It is noted that the statistics of raw SAR data, which resemble Gaussian noise, are completely different from statistics of natural image data.

Block adaptive quantization (BAQ) can be used to compress the raw SAR data acquired by the Magellan spacecraft, see e.g., U.S. Pat. No. 5,661,477, "Methods for compressing and decompressing raw digital SAR data and devices for executing them," and Kwok et al., "Block Adaptive Quantization of Magellan SAR Data," IEEE Trans on Geosc. and Remote Sensing, vol. 27, No. 4, pp. 375-383, July 1989, all incorporated herein by reference. Similar to many conventional image compression methods, BAQ quantizes raw pixel values, e.g. from 8 bits to 4 bits. However, for inputs with a large dynamic range, such as raw data acquired by SAR, the quantization step size has to be adaptive to the level of input signals in order to achieve more efficient compression. Therefore, BAQ adapts the quantization step size for each 16×16 block.

To achieve a higher resolution, the sampling rate of the raw data needs to increase. Given limitation in transmission bandwidth, a higher compression ratio is also needed, while maintaining the quality of the SAR image. BAQ could provide reasonably quality SAR images at moderate compression ratios. However, it is known that the quality degrades substantially when the compression ratio is greater than 2:1. Hence, there is a need to provide a method for compressing raw SAR at an increased compression ratio without decreasing quality.

A number of methods are known for compressing processed SAR data, but relatively few methods have been developed for compressing raw SAR data, see Delp et al., "Image Compression Using Block Truncation Coding (BTC)", IEEE Transactions Communications, Vol. Com-27, No. 9, September 1979, Magli et al., "Wavelet-based compression of SAR raw data," Geoscience and Remote Sensing Symposium, 2002, IEEE International, pp. 1129-1131, and "Frequency domain raw SAR data compression for multi-mode SAR Instruments," National Aerospace Laboratory (NLR), EUSAR 2006, 16-18 May 2006, all incorporated herein by reference.

The BTC method uses a two-level quantizer that adapts to local block properties of the SAR image. That method has a low complexity, and can achieve a high compression ratio, e.g., about 4:1. However, the quality of the output image is substantially degraded. In general, BTC performs worse than BAQ.

Magli et al. apply adaptive quantization to blocks of pixels, as in BAQ. A digital wavelet transform (DWT) is first applied to the raw data, such that the BAQ is performed on wavelet coefficients in the frequency domain. It is well known that the wavelet transform has a high computational complexity relative to block-based scheme and also requires significantly more memory. Thus, that method is not suitable for low complexity devices.

The NLR (FFT-ECBAQ) method applies a 2-dimensional fast Fourier transform (FFT) to the raw SAR data, and then an entropy-constrained BAQ (ECBAQ), followed by entropy encoding. The major drawback of that method is the FFT causes cross-leak noise with smaller block sizes, which implies that larger FFT-sizes are preferred, e.g., an FFT size of 128×64. However, that FFT is too complex to implement in low complexity devices. In fact, that method relies on the fastest known FFT-oriented DSP ASIC (powerFFT™) to compute the long sized FFT. Without that chip, the transform size would have to be greatly reduced, to e.g., by a factor of 8 or 16. The maximum throughput of that method is up to 125 mega-samples per second (MSPS), or 1 Gbits per second, assuming each sample is 8 bits, which is not sufficient for applications requiring higher throughputs, e.g. 4 Gbits per second, as required by applications that aim to reconstruct high resolution SAR images.

It is desirable to have a method and apparatus for compressing raw SAR data, which can achieve an increased compression ratio, high resolution SAR images, while maintaining low hardware complexity, and overcome the disadvantages of the prior art.

SUMMARY OF THE INVENTION

A method compresses synthetic aperture radar (SAR) data by sampling the SAR data into blocks and transforming each block to a corresponding block of transform coefficients. Each block of transform coefficient is quantized according to a quantization parameter to obtain a corresponding block of quantized transform coefficients, which are demultiplexed into sets of blocks of quantized transform coefficients. The quantized transform coefficients in the blocks in each set are arithmetically encoding in parallel according to a probability model to produce an intermediate bitstream for each set of blocks. The encoding of the quantized transform coefficients of one block is independent of the quantized transform coefficients of a successive block. The intermediate of bitstream are then multiplexed to a compressed bitstream, which can be transmitted, or stored, for subsequent decoding to construct an SAR image.

The method can be implemented in field programmable gate arrays (FPGAs). A single FPGA can be used for the entire method. Alternatively, an independent FPGA can be used for each block in the set to encode the blocks in the set in parallel. Another FPGA can then be used for the front end steps.

BRIEF DESCRIPTION OF THE DRAWINGS

FIG. 5 is a table for initializing a quantizing parameter according to embodiments of the invention;

DETAILED DESCRIPTION OF THE PREFERRED EMBODIMENT

The embodiments of our invention describe a method and apparatus for compressing raw synthetic aperture radar (SAR) signals. Due to the hardware constraints, such as memory size, processing power, bandwidth and throughput, the raw SAR data are compressed block by block. To limit complexity and in contrast with the prior art methods, the compression method is design to be effective for relatively small block sizes, e.g. 8×8 or 16×16 pixels. Although the focus of our invention is on limited complexity implementations, larger block sizes can also be used.

Figure 1:
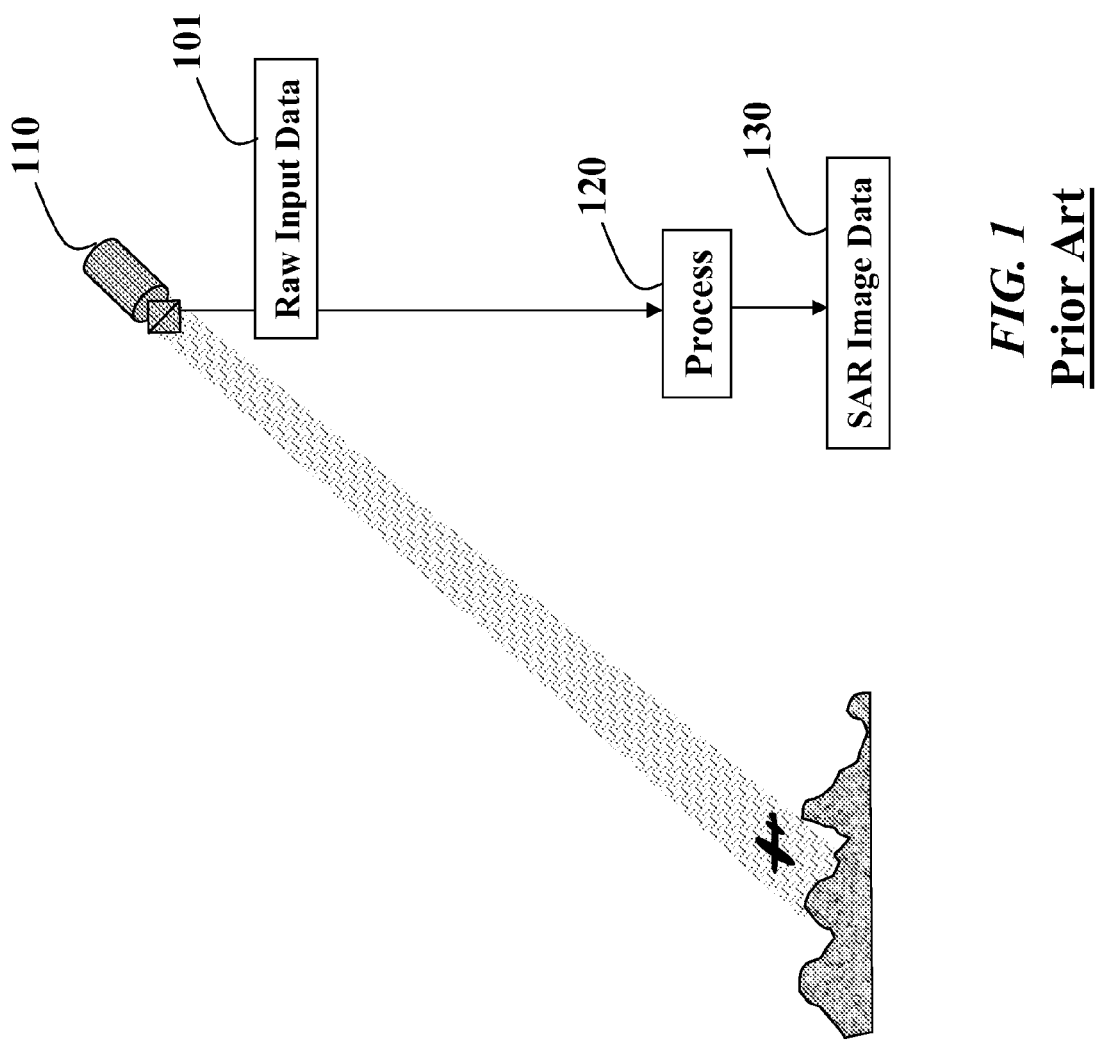
FIGS. 1-2 are block diagrams of a prior art space-borne SAR systems.
Figure 2:
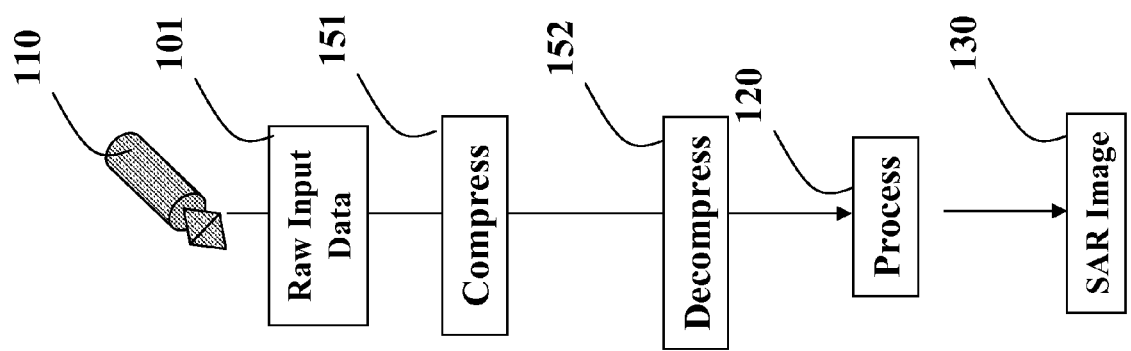
Figure 3:
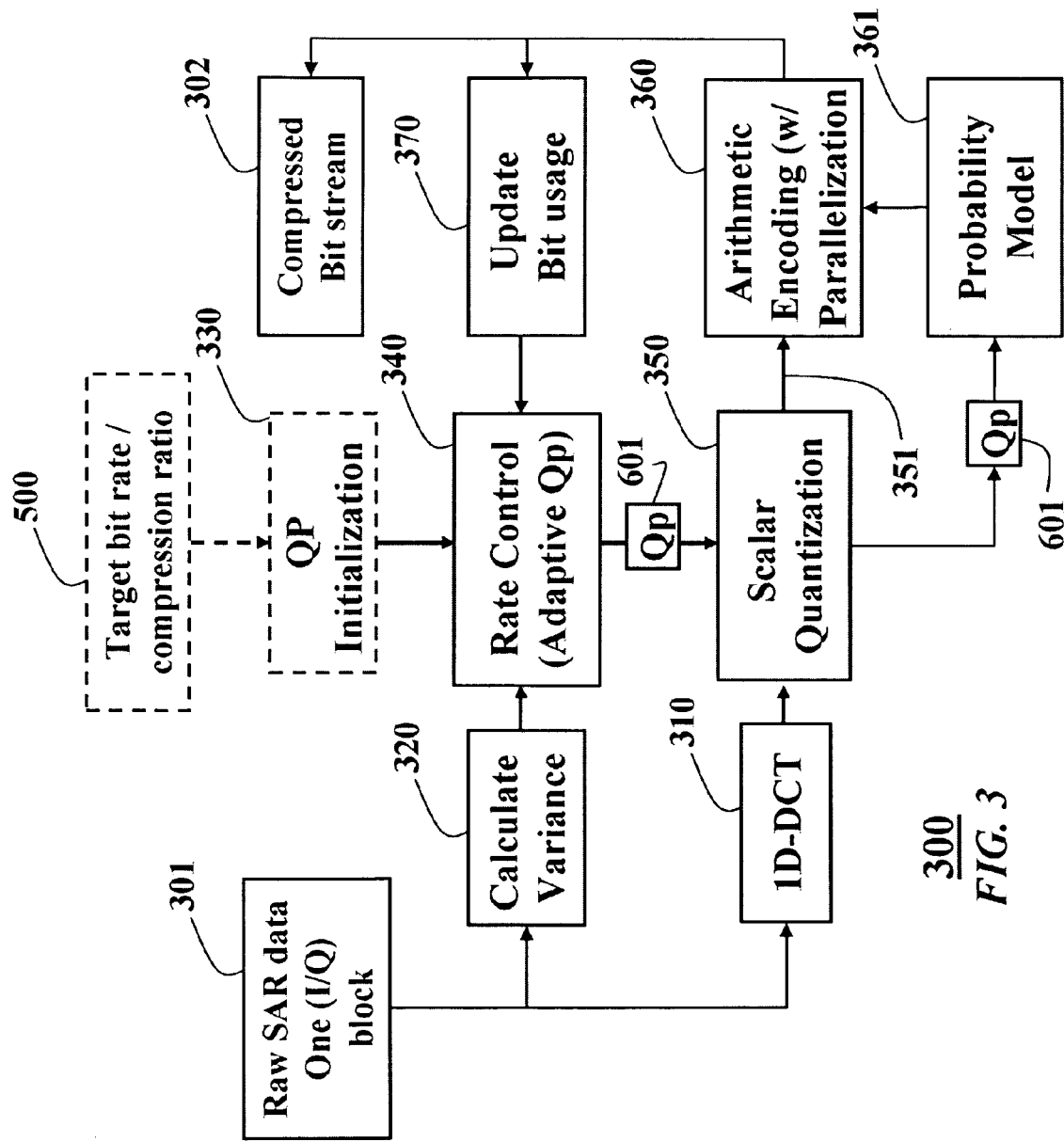
FIG. 3 is a block diagram of the encoding process for compressing one block raw SAR data, according to the invention.

FIG. 3 is a block diagram of our compression method 300. Raw SAR data 301 is input to a transformation module 310. In a preferred embodiment of our invention, the transformation module is a one dimensional discrete cosine transforms (1D-DCT), where DCT coefficients are determined. Higher dimensional transforms, as well as other transform bases, can also be used.

A variance of the raw data in each block is also determined 320. An initial quantization parameter (QP) is determined 330 according to a target output bit rate or compression ratio stored in a table 500, see FIG. 5. A rate control module 340 adjusts the initial QP according to the variance, a pre-determined set of thresholds, and a bit usage ratio that is based on output bits of previously coded blocks relative to the target bit-rate, to yield an adjusted QP value 601. Then, the adjusted QP value is used to quantize 350 the transform coefficients to yield quantized transform coefficients.

The QP value 601 and the quantized transform coefficients 351 are sent to a modified arithmetic encoder 360, which uses a probability model 361.

Our samples are independent and randomly distributed. Therefore, our probability model is conventional and represents the random distribution of the quantized transform coefficients. It is defined on our sample space, samples and probabilities of each sample. The model can be linear, binomial, or Gaussian as known in the art. The model can be learned from SAR training data or updated based on previously coded data. In our invention, a separate model is maintained for each quantized transform coefficient in a block, e.g., the DC coefficient has one probability model, while each of the AC coefficients have their own probability models.

Conventional arithmetic coding is well known for its efficient compression capability. However, conventional arithmetic encoders are limited to sequential processing. This means that conventional arithmetic encoders are not suited for low complexity hardware devices with high throughput requirements. In our invention, we describe a parallel design for arithmetic encoding that makes it possible to realize higher throughput with low complexity hardware.

The output of our arithmetic encoder 360 is a compressed bitstream 302. A bit count is provided as feedback to the rate control module 340 to update 370 the total bit usage ratio, and adjust the QP as needed. It is noted that the Qp used for encoding each block is also inserted into the compressed bitstream to be used during subsequent decoding.

Figure 4:
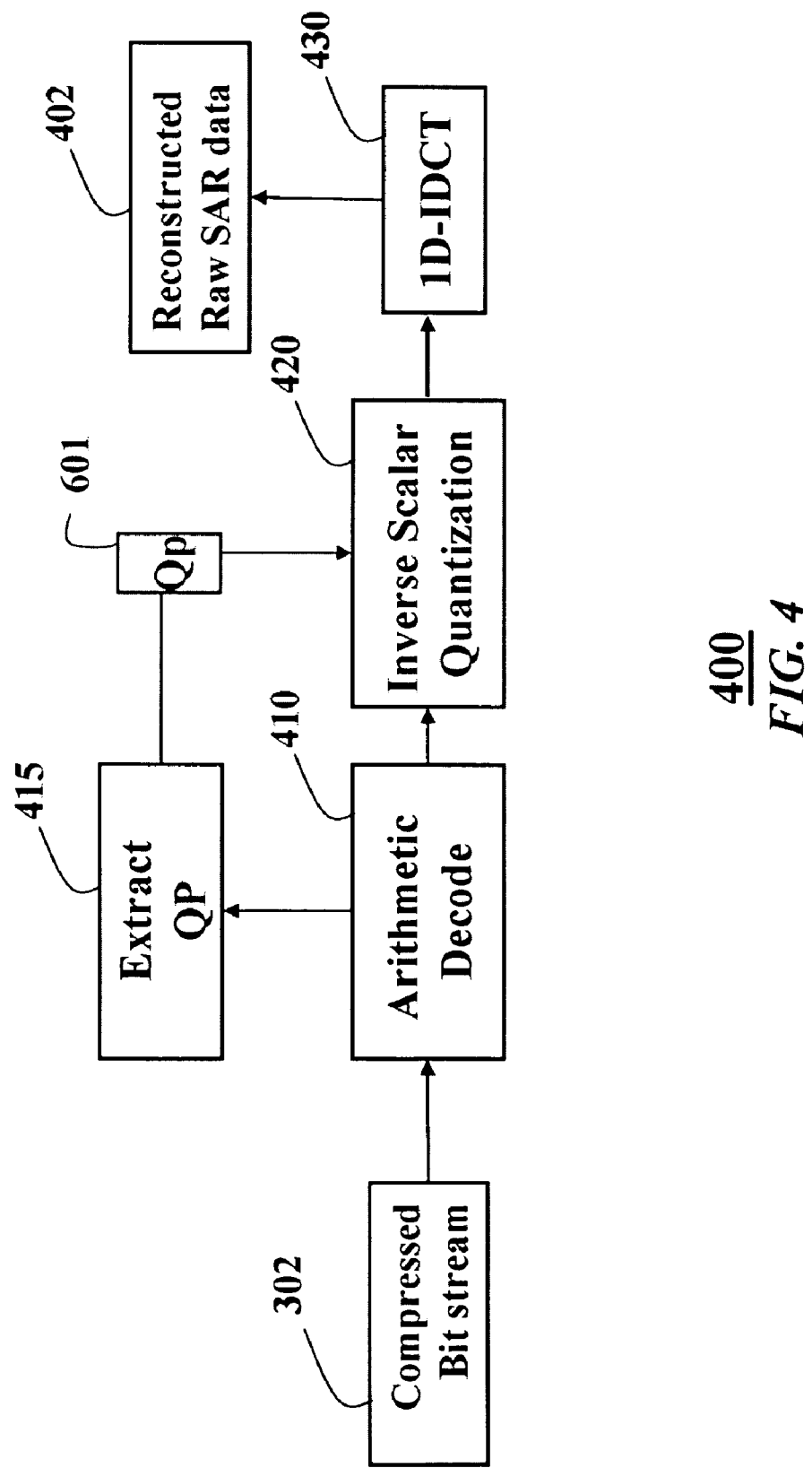
FIG. 4 is a block diagram of the process for decoding one block raw SAR data, according to embodiments of the invention.

FIG. 4 shows the corresponding decoder 400, which reverses the encoding process. The compressed bit stream 302 is first passed to a modified arithmetic decoder 410. The decoded coefficients are inverse scalar quantized 420 by multiplying the corresponding QP 601 extracted 415 from the bitstream 302 with the transform coefficient. Then, an inverse 1D-DCT transform 430 is applied to obtain reconstructed raw SAR data 401.

Figure 7:
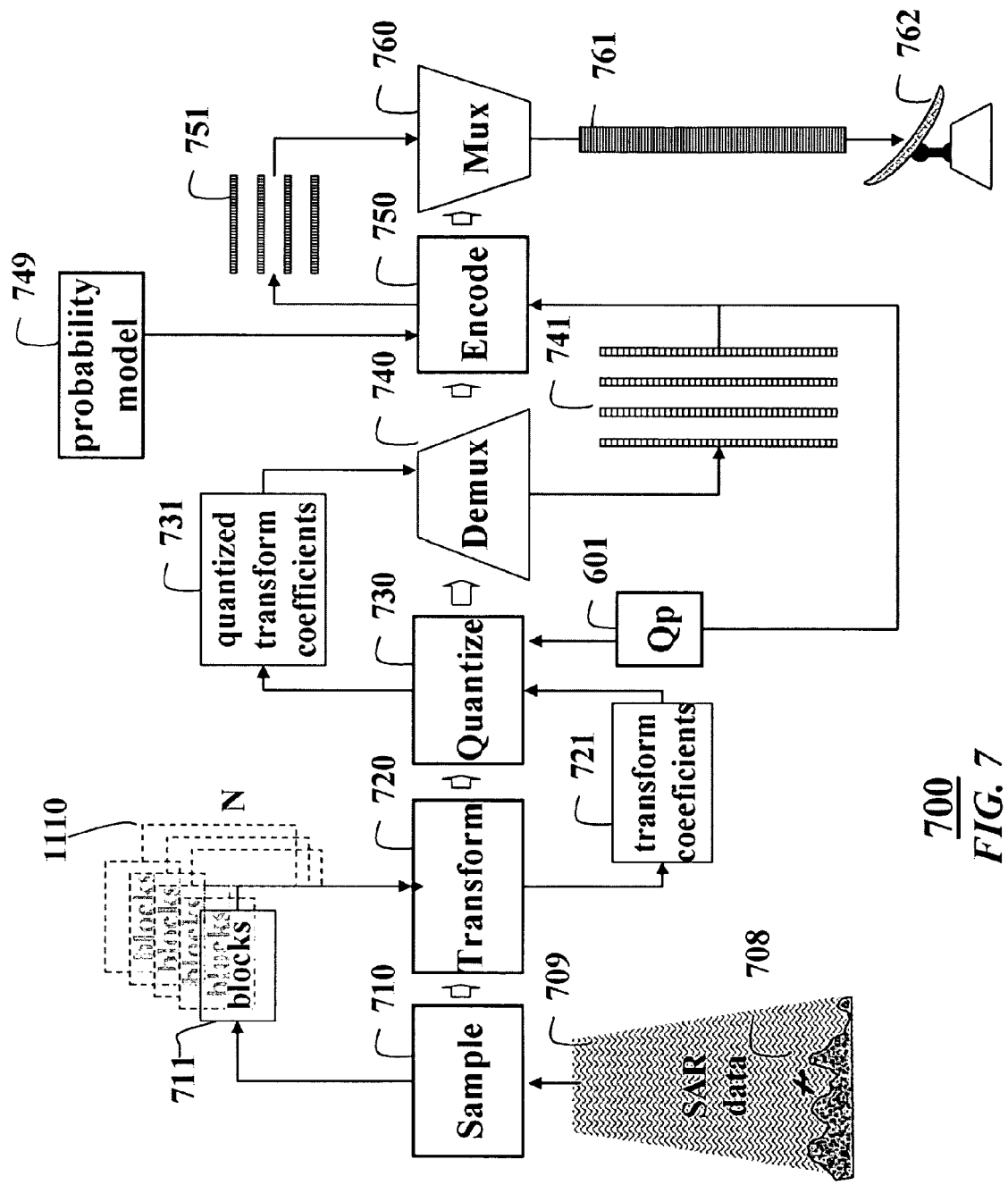
FIG. 7 is a flow diagram of a method for compressing raw SAR data according to embodiment block-based rate control, according to the invention.

FIG. 7 shows the method 700 in greater detail. We sample 710 SAR data 709 acquired of an object or terrain 708 into small 8×8 blocks 711. A 1D-DCT is applied 720 to produce corresponding blocks of transform coefficients 711, which are quantized 730 according to a quantization parameter (QP) 601 to obtain a corresponding block of quantized transform-coefficients 731.

The blocks 731 are demultiplexed 740 into sets of N blocks 741. The N blocks in each set are encoded 750 arithmetically and in parallel according to a probability model 749 to produce an intermediate bitstream 751 for each set of blocks. The encoding of the quantized transform coefficients of one block is independent of the quantized transform coefficients of successive blocks. The intermediate bitstreams are multiplexed 760 to a compressed bitstream 761 for further processing on the ground 762.

It should be noted that the demultiplexing 740 can be performed during the sampling 710 so that the N streams of blocks 1110 are produced in parallel as indicated by dashed lines. In this embodiment, there are N data streams processed in parallel by the transform, quantization and encoding modules, also see FIG. 11.

Transform

In a preferred embodiment of our invention, the 1D-DCT is used to transform the input signal from a spatial sample domain to a frequency domain. The 1D-DCT does not compress the raw SAR data, but decorrelates the SAR data to facilitate more efficient compression. Relative to the 2D-DCT the 1D-DCT has a lower complexity. Also, due to the nature of the raw SAR data, which resembles Gaussian noise, there is not a substantial gain provided by performing a 2D transformation, especially for small block sizes.

In our invention, the 1D-DCT is performed along rows of each block, which corresponds to range directions in the raw SAR data. Columns correspond to the azimuth angle. With a block size of 8×8, an 8×1 DCT is applied to each row, and the eight rows of the 8×1 DCT coefficients together form our 8×8 block of transform coefficients.

QP Initialization

The QP is initialized according to the target bit-rate or compression ratio. The target compression ratio is determined from a given transmission bandwidth, e.g., a target bit rate, and the size of raw SAR data without compression, in number of bits. The target compression ratio is an input parameter to our arithmetic encoder 360.

As shown in FIG. 5, an empirical relationship between a target bit rate 501, a target compression ratio 502, and an initial QP 503 used in all blocks can be determined 330 from the training SAR data. Then, the initial QP can be obtained via look-up on the table 500, based on the target compression ratio.

For applications that require finer control of the output bit-rate, the initial QP can also be adjusted by the variance to better-allocate and utilize the available bit rate, and thus achieve a better overall compression. This rate control procedure is described in further details below 340.

Adjusting the QP

The QP is adjusted for the purposes of maximizing compression quality and rate control. The adjustment is mainly based on two factors, the block data entropy, and the consumed or remaining number of bits. Higher entropy implies that more information is contained in the data block, thus a smaller QP should be applied for more conservative compression. Similarly, lower entropy implies that less information is contained in the data block, and a larger QP should be applied for more aggressive compression. Because the calculation of entropy is too complex for low-cost hardware devices, the block variance is a good approximation of the entropy, and not as computationally demanding to calculate as entropy.

Figure 6:
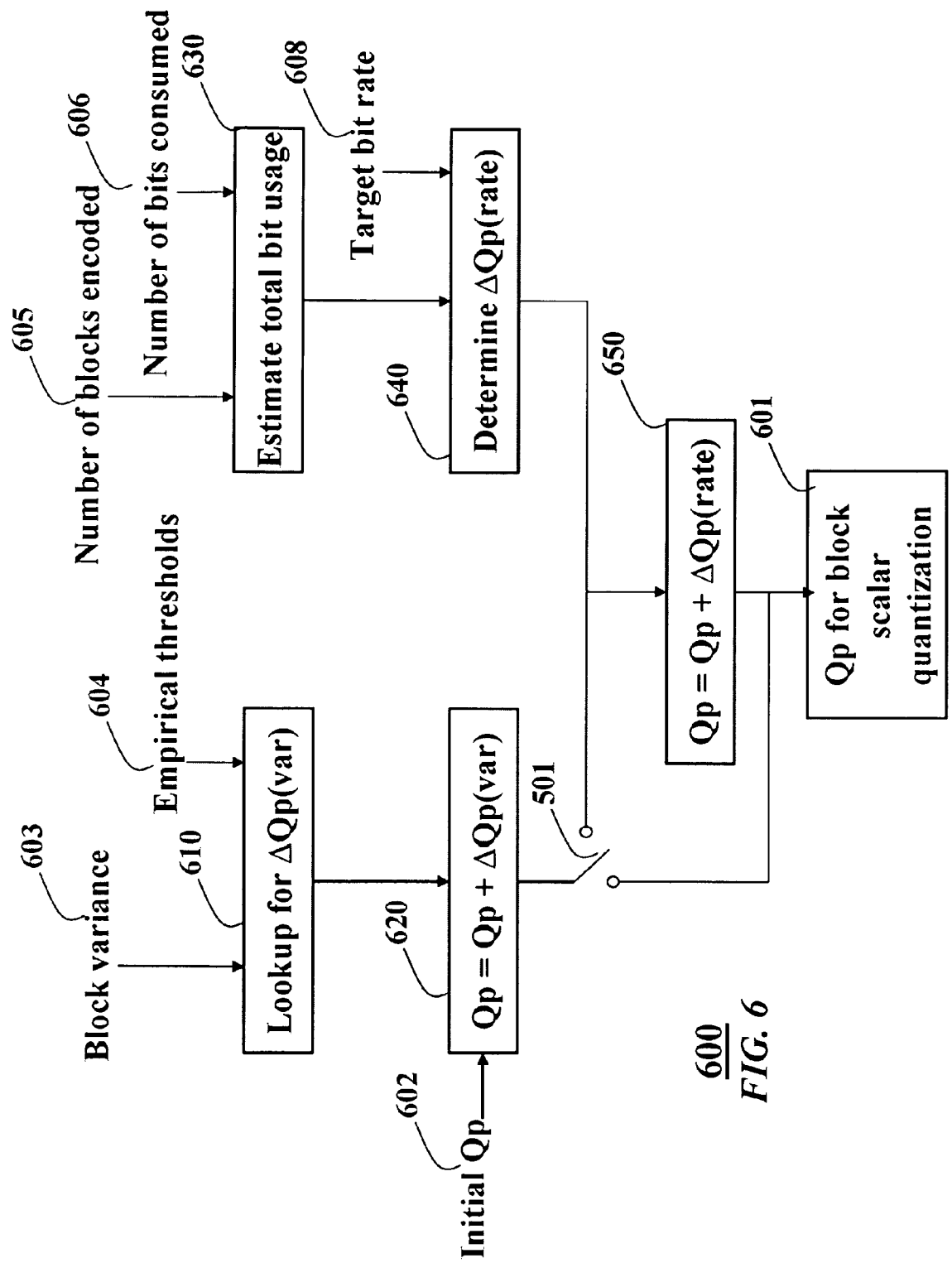
FIG. 6 is a block diagram of block-based bit allocation, according to embodiments of the invention.

FIG. 6 shows a process 600 for adapting the QP 601 for each block, from the initial QP 602, based on two factors, namely the block variance 603, and a bit usage ratio. The block variance 603 is determined 320 from all sample values in the input block, e.g., the 256 samples in one 8×8 block. Then, the variance is compared with a set of pre-defined thresholds 604 in the table 500 by look-up 610. These thresholds are empirically determined from the training SAR data, and are programmable for specific devices.

Each threshold corresponds to a QP difference (ΔQp). This correspondence is represented by the table 500. By comparing the variance and searching the table, the QP difference ΔQp(var) is determined 610. For example, if the variance is smaller than the first threshold, then the QP difference ΔQp (var) is set to be the first ΔQp in the table. The initial QP is determined as described above according to the target compression ratio and is used as the initial QP for all blocks of the raw SAR data. By adding 620 the QP difference ΔQp(var) to the initial QP, the adjusted QP is obtained.

As described above, another factor that affects the QP is the bit usage ratio. This adjustment could also be made when rate control is required and enforced. In order to determine the QP difference influenced by the bit usage ratio, i.e., ΔQp(rate), the estimated total bit usage is first determined 630 from the number of blocks coded 605 and number of bits consumed 606 to encode the blocks. Then, the estimated total bit usage is 607 compared with target bit rate 608 to determine 640 the ΔQp(rate). The details on the method for calculating the total bit usage and ΔQp(rate) are described below. The ΔQp(rate) is then added 650 to the previously adapted QP, i.e., the adjusted QP 601 is equal to the initial QP+ΔQp(var)+ΔQp(rate).

In order to examine the bit usage condition, three variables, i.e., the total number of blocks, the number of blocks that have been encoded 605, and the number of bits that have been consumed 606, are first obtained for estimating the total number of bits that will be approximately required to encode the raw SAR data 301. This approximation is then compared with the target bit usage. If the approximated bit usage is greater and exceeds a tolerance percentage, then the QP is increased. Otherwise, if the approximated bit usage is less than the target bit usage and exceeds the tolerance percentage, then the QP is decreased.

After each block is encoded, the total number of encoded blocks 605 and the total number of consumed bits 606 are updated. Before quantizing the current block, the approximate total number of bits 630 is determined by (number of consumed bits)/(number of coded blocks)×(number of total blocks. Then the estimated total bit usage is compared to the target bit usage.

The ratio of (estimated total bits:target total bits) is determined. If the ratio is greater then one, then the bit consumption is exceeding the bit budget. Otherwise, it is within the budget. By subtracting one from this ratio, the percentage of estimated total bits that are exceeding or below the target is given. This percentage is then divided by a tolerance threshold in order to find out how many times the estimated bit rate exceeds or is under a specified tolerance.

For example, if the application can tolerate 5% bit rate variance, while the ratio of estimated bit usage to target bit usage is 9%, then the estimation is (9/5) times above the tolerance.

Quantization

The transform coefficients are subject to the scalar quantization 350. The scalar quantization is a lossy compression, the larger the QP value, the coarser the compression quality.

In one embodiment, uniform scalar quantization is applied to all transform coefficients obtained form the 1D-DCT. In a second embodiment of this invention, non-uniform quantization of the transform coefficients is applied, where the QP value for the block is further modified by a quantization matrix that determines a non-uniform scaling for each transform coefficient.

Parallel Arithmetic Coding

The quantized transform coefficients are losslessly encoded by our modified arithmetic encoder. One major drawback of the conventional arithmetic encoding method is its sequential processing nature, which makes it unsuitable for low complexity devices and where a high throughput is required. In the conventional method, the encoding has to be performed symbol-by-symbol and block-by-block. The reason is that the encoding of one syntax element, e.g., a quantized transform coefficient, can depend on the following elements. In some cases, a number of successive elements are encoded jointly.

Without parallelization, block(n+1) is encoded after block (n), and the last element of block(n) can be dependent on elements of block(n+1). That is, the bits to represent the last element of block(n) can depend on the first or later element in block(n+1), or a probability of this element. Furthermore, those bits can only be written to the bit stream after the first or later element of block(n+1) is encoded.

Arithmetic encoding is a method for lossless data compression that uses variable-length entropy encoding. Frequently used bit strings are represented by fewer bits, and infrequently used bit strings use more bits. In contrast with other entropy encoding techniques, such as Huffman encoding that separate the input data into component strings and replace each string with a code word, arithmetic coding encodes the entire input data with a single code word, e.g., a fraction n in the range [0, 1]

Arithmetic encoding works as follows. First, we begin with a "current interval" [Low, High) initialized to [0, 1). Then, for each symbol (bit string), perform two steps:

(a) Subdivide the current interval into subintervals, one for each possible symbol, where the size of the subinterval is proportional to the estimated probability of the symbol according to the probability model; and (b) Select the subinterval corresponding to the symbol that actually occurs, and make it the new current interval. A sufficient number of bits must be output to distinguish the final current interval from all other possible final intervals.

Arithmetic encoding scales the cumulative probabilities given by the probability model into the interval [Low, High) for each symbol encoded. When Low and High are very close together, so close that this scaling operation maps some different symbols of the probability model onto the same integer in the [Low, High) interval, the encoding cannot continue until the next symbol (or symbols) are encoded.

In arithmetic encoding, a bit can be written only when the first bit in Low and High are identical. If Low is 0 . . . and High is 0 . . . , then write a zero bit, or if Low is 1 . . . and High is 1 . . . , then write a one bit. Thus, no bit can be written when Low is 01 and High is 10. This can happen when First-quarter≦Low<Half≦High<Third-quarter. In this case, the two bits for Low and High have opposite polarity, either 01 or 10. For example, if the next bit turns out to be zero, i.e., High descends below Half and [0, Half] is expanded to the full interval, the following bit is one, because the range of the interval has to be above the midpoint of the expanded interval. After the interval expansion, it is still possible to have First-quarter≦Low<Half≦High<Third-quarter. In this case, the arithmetic encoder continues to examine whether the next Low and High have identical bits that can be written.

Conversely, if the next output bit is one, then the arithmetic coder writes a zero bit afterwards. In this way, the interval can safely be expanded. That is, when a bit can be output, it is followed by a certain number of bits of opposite parity. Sometimes, after one or more interval expansions, the [Low, High) still falls in the condition First-quarter≦Low<Half≦High<Third-quarter. In this case, the number of times that the interval is expanded without writing any bits is recorded in a variable f. Then, when a bit is finally written, it is followed by a total number of f opposite parity bits. These bits are called follow bits.

In order to break the dependency that is intrinsic to conventional arithmetic encoding, and thus achieve parallelization, a compatible encoding scheme writes the bits corresponding to the quantized transform coefficients in a block after the last coefficient of each block is encoded, regardless of any elements in the next block.

In our invention, we describe an enhanced modified arithmetic coding that uses a "stop mark" for a set of blocks. This eliminates the dependency between blocks and allows a parallel implementation. The effect is that multiple symbols, which correspond to quantized transform coefficients in our invention, can be encoded concurrently. In order to achieve this, the coding dependencies among successive symbols are broken. A consequence of this enhancement is that there are additional redundant bits in the bitstream. Normally, the more independent the symbols are encoded, the more flexible parallelization can be achieved at the cost of higher bit rate. In the following, we describe a block-level parallel design, which provides a good tradeoff between encoding efficiency and parallelization.

Our invention achieves parallelization by invoking the following process. If the "Low" from the last element (quantized transform coefficient) is less than a quarter of the largest pre-defined possible code value, e.g., 65535, or 1 if normalized, then the arithmetic encoder writes a zero bit, followed by (f+1) one bits, followed by a zero bit. Otherwise, if the last element is greater than or equals to a quarter of the largest pre-defined possible code, then the arithmetic encoder writes a one bit, followed by (f+1) zero bits, then followed by a one bit. By writing this additional bit after the follow bits, the end of each block is independently encoded, and the symbols of the current block are unambiguously represented in binary form and without any ambiguity for the decoder regarding the symbol to be reconstructed.

The last bit is necessary if the decoder does not fully follow the f bits counting process as performed by the encoder. In the case that the decoder does follow the f bits counting process as performed by the encoder, which incurs additional complexity, then it is not required that the last bit be written to the output. With this approach, however, the encoding of the quantized transform coefficients of one block is still independent of the quantized transform coefficients of a successive block.

Figure 8:
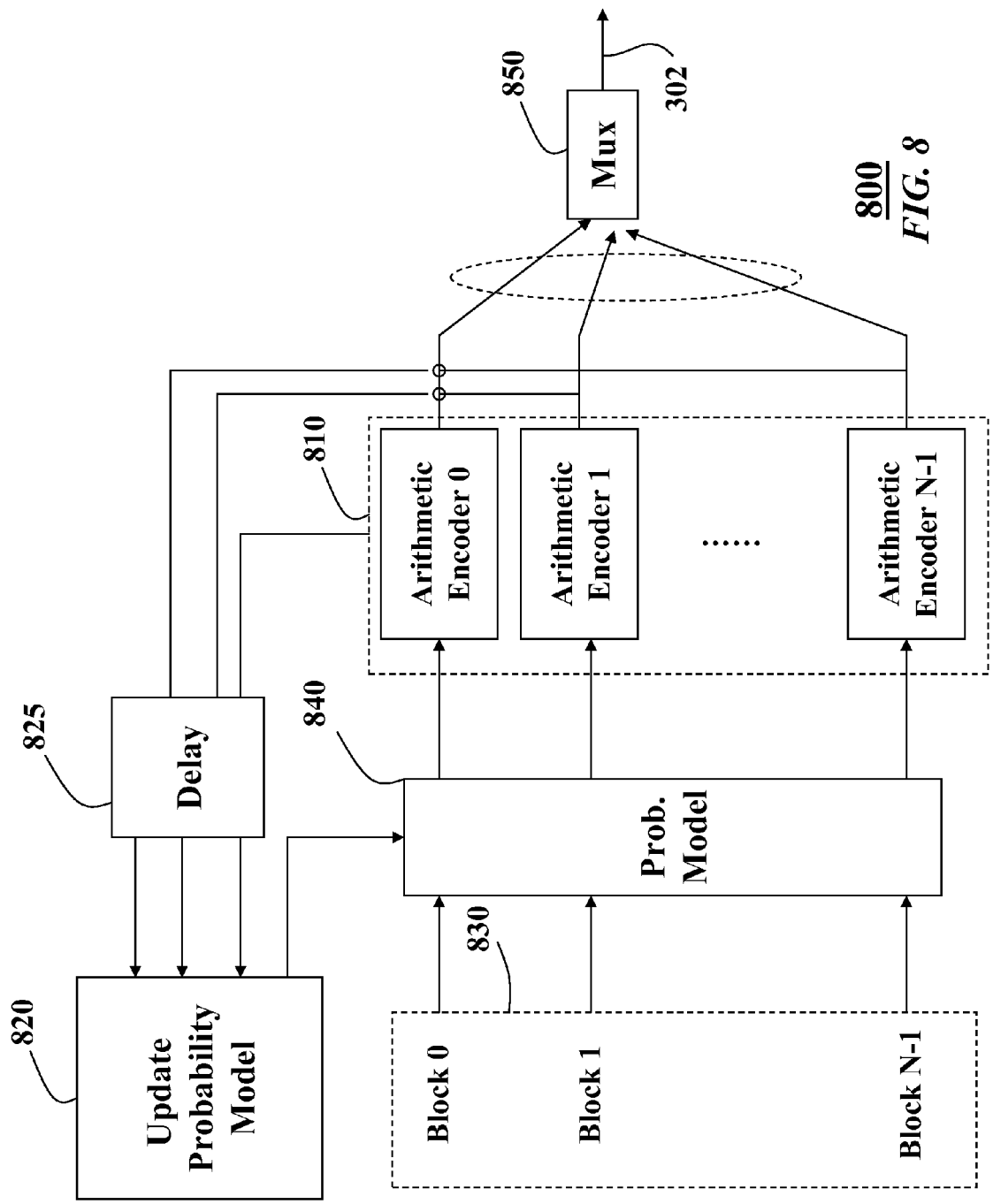
FIG. 8 is a block diagram of modified arithmetic coding stricture with parallel design according to embodiments of the invention.

FIG. 8 shows our parallel design for context adaptive arithmetic encoding with N arithmetic coding units 810 operating in parallel and utilizing the methods described above. A probability model 840 is used for each transform coefficient. An accurate probability model generally yields better coding performance. In a static design, the probability model can be obtained from the training data and is not updated during the encoding.

In conventional adaptive arithmetic encoding, the probability model is updated after each symbol is encoded. Then, the model is used to better encode the next symbol. However, in our parallel design, updating the model on a symbol-basis from multiple units is not manageable and could cause read-write chaos under a race condition, i.e., the order of reads and writes could be undetermined.

In one embodiment of our invention, which as shown in FIG. 8, each of the arithmetic encoding units encodes, in parallel, one of the blocks in the set of N blocks 830 of quantized transform coefficients based the probability model 840 that is common among all arithmetic encoding units. For this case, the model is updated 820 only after a delay 825 when the encoding of the N blocks 830 is completed, while remaining static during the process of encoding all blocks in one cycle. This design also extends to the case in which the update is made after N blocks are encoded over a predetermined period of time. The intermediate bitstreams of the encoders 810 are multiplexed 850 to produce the output bitstream 302.

In a second embodiment of the invention, each of the arithmetic encoding units encodes one block of quantized transform coefficients based on a specified probability model that is specific to that unit and independent from other units. Updates to the probability model for each unit are performed independently and based only on data that the particular unit encodes.

In both of the above embodiments, the probability model(s) could also be updated 820 periodically, over time, based on the statistics of previously encoded symbols.

To encode the quantized transform coefficients, which are in the range [−512/QP, +511/QP], one embodiment of our invention first adds an offset of (512/QP) so that all coefficients to be encoded are in the range [0, 1023/QP], and then apply arithmetic encoding as described above. This embodiment requires 1024/QP*N bits of memory for each probability model, where N is the number of bits to represent the probabilities for each quantized transform coefficient in the probability model.

We realize that the probability distribution of quantized transform coefficients is symmetric. Therefore, we can reduce the size of the memory by encoding the absolute value of the quantized transform coefficients without the offset, i.e., the absolute value of coefficients in the range [−512/QP, +511/QP]. If the value is not zero, then an unencoded sign bit is written to the intermediate bitstream, separately. That is, the sign bits are not arithmetic encoded. This change effectively reduces the required memory for each probability model by at least a factor of two from 1024/QP*N to 512/QP*N. The overall memory savings can be greater if there are separate probability models for each quantized transform coefficient, and the implementation might store several versions of the same table to satisfy timing requirements for read/write operations.

Hardware Design

Field programmable gate arrays (FPGA) are typical for onboard SAR processing. However, as compared to semi-custom ASIC and other custom silicon devices, FPGA performance is typically far more limited. In particular, radiation-tolerant and military application devices typically have lower performance than state of art commercial devices.

Figure 9:
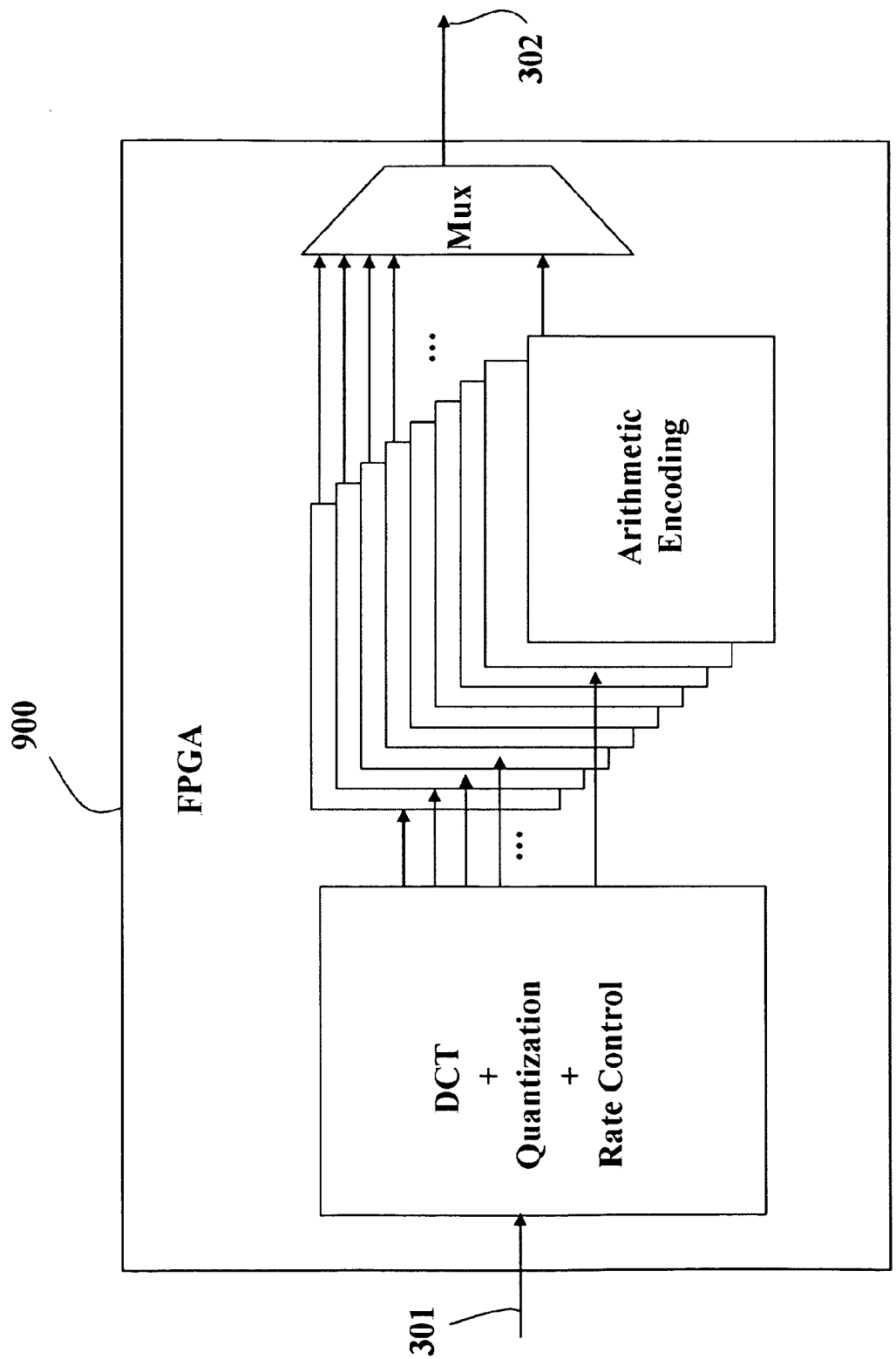
FIG. 9 is a block diagram of a single FPGA hardware design according to embodiments of the invention.

As shown in FIG. 9 for a first embodiment of our invention, the compression methods are implemented in a single FPGA 900. The advantage of this embodiment is that only a single piece of hardware is required. Although all processing is realized in the single FPGA 900, the arithmetic coding units are still implemented in parallel to satisfy throughput requirements.

Figure 10:
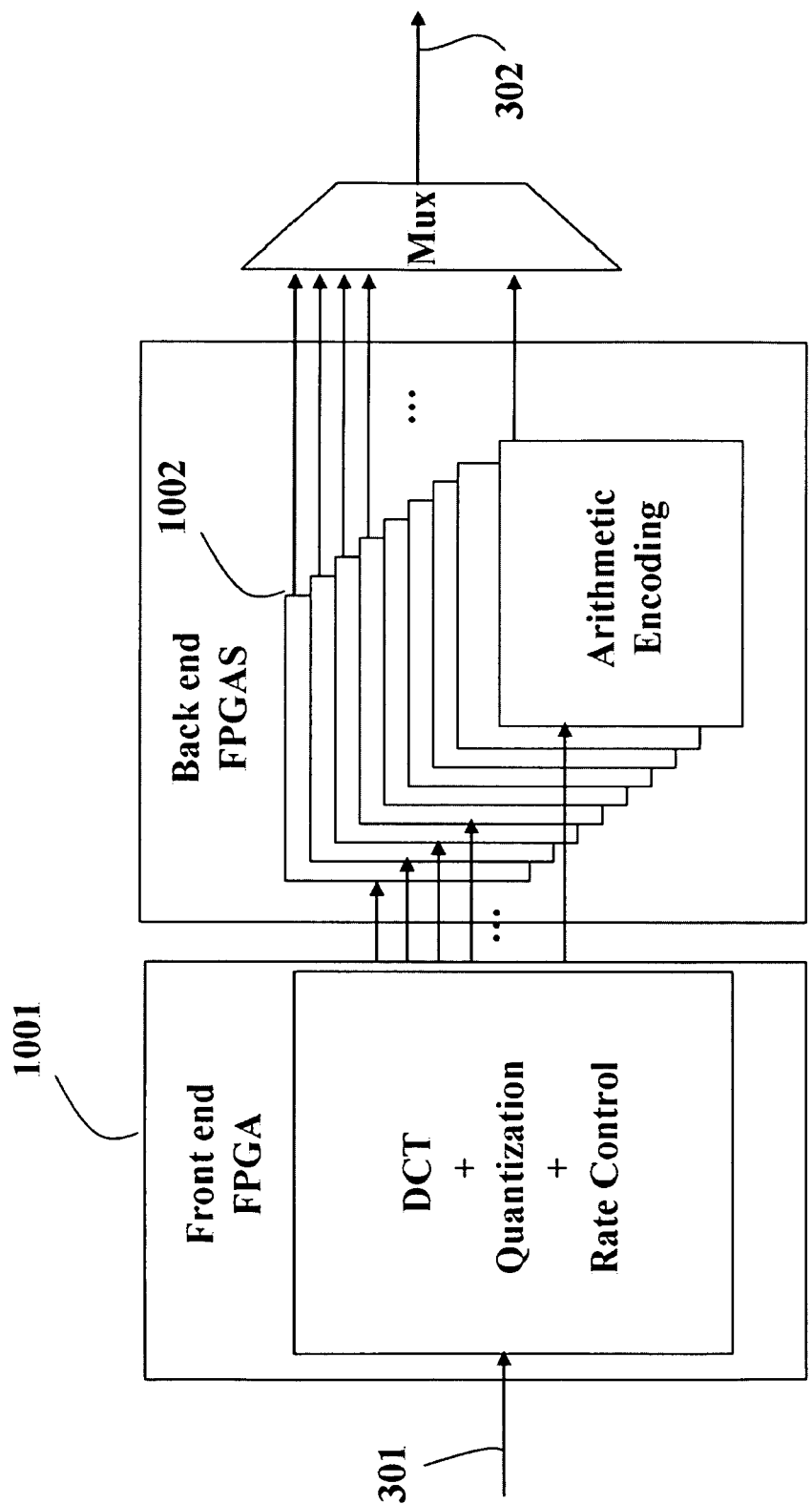
FIGS. 10 and 11 are a block diagrams of a multiple FPGA hardware design according to embodiments of the invention.

As shown in FIG. 10 for a second embodiment of this invention, the compression methods are realized with multiple FPGAs 1001-1002 to attain a higher throughput. This design partitions all front end operations into a single FPGA 1001. The arithmetic coding is then implemented in multiple FPGAs 1002, each corresponding to a parallel channel. This design facilitates more flexibility between hardware and timing than the single FPGA design.

Figure 11:
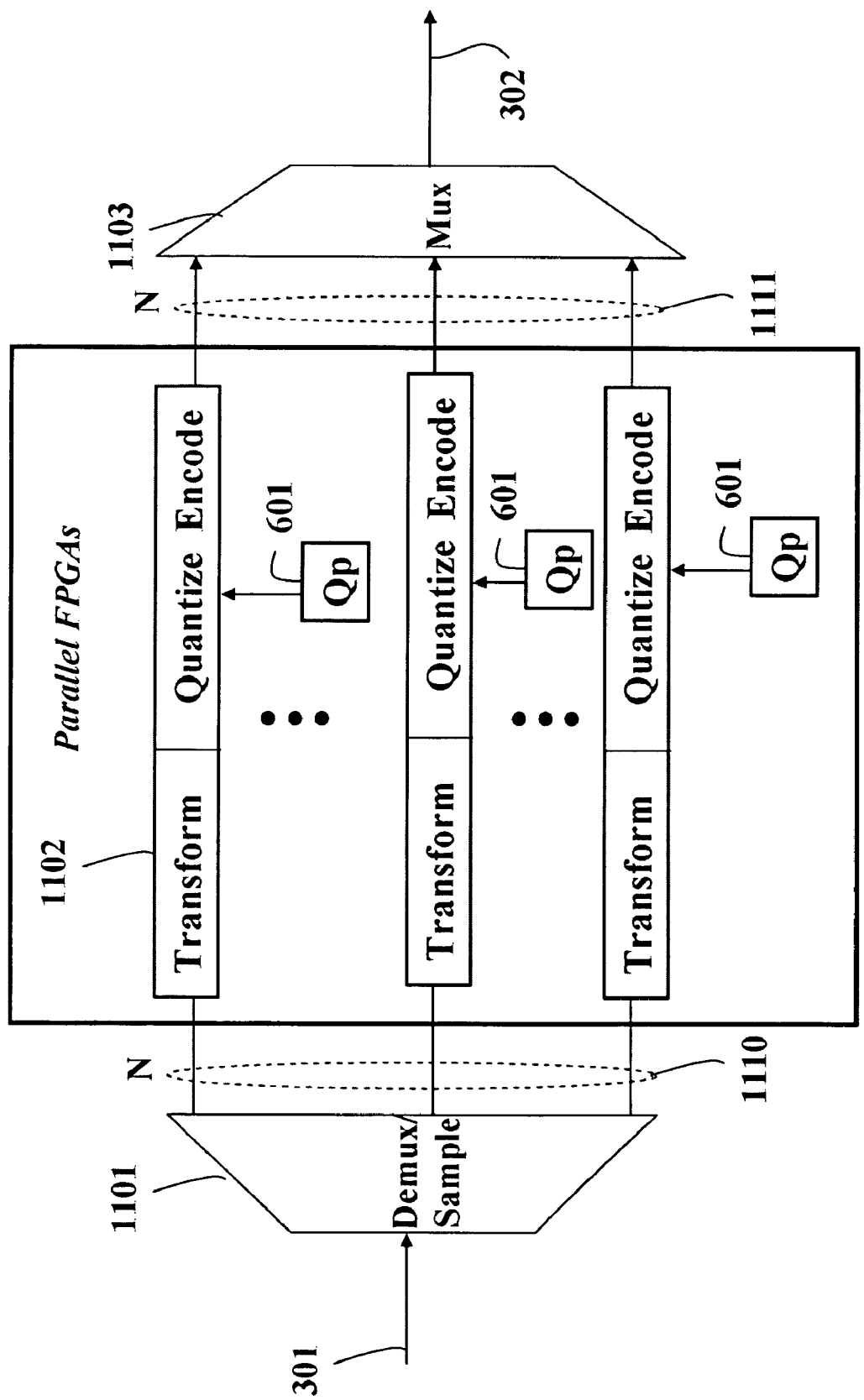

As shown in FIG. 11 for a third embodiment of the invention, the SAR are demultiplexed and sampled 1101 into N streams of blocks. Each stream is processed in parallel by an independent FPGA 1102 to produce N intermediate bit streams 1111, which are then multiplexed into the compressed bitstream 302.

It is emphasized that the modified arithmetic encoding method according to the embodiments our invention enables the designs described above to attain high throughput through parallelization.

Comparison to Prior Art

In contrast to the prior art systems, our system has significant differences and advantages.

Compared to the conventional BAQ approach, our invention is more comprehensive. In contrast with BAQ, which processes block adaptive quantization to raw data samples, our invention also involves a discrete cosine transform, entropy coding and rate control. The quantization in our invention is performed in the frequency domain. Furthermore, the scalar quantization in our invention is different than the quantization in BAQ, which is computational simpler and very efficient combined with entropy coding. With this comprehensive design, higher compression ratios are achievable without severe degradation of compression quality.

Relative to the FFT-ECBAQ method, our invention is different in several ways. First, a shorter length 1D-DCT is used to transform samples into the frequency domain, which makes our encoding more practical and feasible for limited complexity platforms. Compared with long size 2D-FFT in FFT-ECBAQ, our invention significantly reduces the hardware complexity. Thus, our invention can be implemented in one FPGA, without requiring the accessibility to other external chips. The reason why shorter transform size can be used in our invention, without severe loss of compression quality, is because that we use different block adaptive quantization scheme.

The quantization used by our invention is scalar quantization, which applies a uniform division of all DCT coefficients in the block. Thus, we do not need the block size to be large for bit allocation within one block, as performed in FFT-ECBAQ.

In fact, the bit allocation in our invention is among smaller sized blocks, according to the block variance, as an approximation of block entropy. This bit allocation "moves" more bits to blocks containing more information, i.e., with greater variance, in order to achieve higher overall quality.

We adapt the QP for a block with a rate control procedure. The type of entropy coder in FFT-ECBAQ is not specified; whereas in our invention, we used arithmetic encoding for more efficient compression. Moreover, the arithmetic encoder and decoder used by our invention are modified to enable a parallel design.

Comparing to other prior art method, Such as BTC, our invention is different and more advanced, by introducing a DCT, entropy coding and more efficient quantization, with block-based bit allocation and rate control. Our invention yields a much higher performance.

It is to be understood that various other adaptations and modifications can be made within the spirit and scope of the invention. Therefore, it is the object of the appended claims to cover all such variations and modifications as come within the true spirit and scope of the invention.

We claim:

1. A method for compressing synthetic aperture radar (SAR) data, comprising the steps of:
    sampling the SAR data into blocks of SAR data;
    transforming each block of SAR data to a corresponding block of transform coefficients;
    quantizing each block of transform coefficient according to a quantization parameter to obtain a corresponding block of quantized transform coefficients;
    demultiplexing the blocks into sets of blocks of quantized transform coefficients;
    encoding arithmetically and in parallel, the blocks in each set of blocks of the quantized transform coefficients according to probability models to produce an intermediate bitstream for each set of blocks of quantized transform coefficients, where the encoding of the quantized transform coefficients of one block is independent of the quantized transform coefficients of a successive block; and
    multiplexing the intermediate of bitstreams to a compressed bitstream, wherein the sampling, transforming, quantizing, demultiplexing, encoding, and multiplexing are performed in an apparatus including an encoder.

2. The method of claim 1, in which a size of each block of SAR data is 8×8 or 16×16 pixels.

3. The method of claim 1, in which the transforming uses a one-dimensional discrete cosine transform.

4. The method of claim 1, further comprising:
    determining a variance for each block of SAR data.

5. The method of claim 4, in which the quantization parameter depends on the variance and a target bit rate or compression ratio.

6. The method of claim 4, further comprising:
    adjusting the quantization parameter according to the variance, a pre-determined set of thresholds, and a bit usage ratio that is based on output bits of previously encoded blocks relative to the target bit-rate, to yield an adjusted QP value.

7. The method of claim 1, in which the quantizing is scalar.

8. The method of claim 6, in which a number of the output bits is provided as feedback to adjust the quantization parameter.

9. The method of claim 1, further comprising:
decoding the compressed bitstream to construct a SAR image.

10. The method of claim 1, in which the transform coefficients are subject to scalar quantization, such that the scalar quantization is a lossy compression, in which a larger QP yields a coarser compression quality.

11. The method of claim 1, in which the quantizing uses a quantization matrix that determines a non-uniform scaling for each transform coefficient.

12. The method of claim 1, in which the probability models correspond to one probability model for each possible transform coefficient.

13. The method of claim 1, in which the probability models are updated after encoding the set of blocks.

14. The method of claim 1, in which the encoding uses an arithmetic encoding unit for each block in the set, and there are probability models for each arithmetic encoding unit.

15. The method of claim 1, in which the method is implemented in a single field programmable gate array.

16. The method of claim 1, in which arithmetic encoding unit is implemented in a set of field programmable gate arrays, there being one field programmable gate array for each block in the set.

17. The method of claim 1, in which the quantizing is a uniform quantization.

18. The method of claim 1, in which the quantizing is a non-uniform quantization.

19. The method of claim 1 in which the encoding of the quantized transform coefficients of one block is independent of the quantized transform coefficients of a successive block forcing the encoding of a last quantized transform coefficient of the block and writing the corresponding bits to the intermediate bitstream.

20. The method of claim 1, further comprising:
determining the probability model from training data.

21. The method of claim 1, in which there is a probability model for each transform coefficient based on its position in the block and quantization parameter.

22. The method of claim 1, further comprising:
updating the probability models according to a distribution of previously encoded quantized transform coefficients.

23. The method of claim 22, in which the updating is performed after encoding each quantized transform coefficient.

24. The method of claim 22, in which the updating is performed after encoding each blocks.

25. The method of claim 22, in which the updating is performed after encoding the set of blocks.

26. The method of claim 22, in which the updating is performed after a predetermined period of time.

27. The method of claim 6, in which each threshold is a QP difference $\Delta Qp$ further comprising:
adjusting the QP by the QP difference $\Delta Qp$ before encoding a next block.

28. The method of claim 5, further comprising:
looking up the target bit rate in a table obtained from training SAR data.

29. The method of claim 1, further comprising:
looking up the quantization parameter in a table obtained from training SAR data.

30. The method of claim 1, further comprising:
adding an offset value to each quantized transform coefficients to make all quantized transform coefficients positive.

31. The method of claim 1, in which the probability models corresponding to the quantized transform coefficients are symmetric about zero, and in which the encoding encodes an absolute value of each quantized transform coefficient, and further comprising:
writing an unencoded sign bit of the quantized transform to the intermediate bitstream to reduce memory requirements.

32. The method of claim 1, in which the quantization parameter for each block is encoded in the compressed bitstream.

33. An apparatus for encoding synthetic aperture radar (SAR) data, comprising:
means for sampling the SAR data into blocks of SAR data;
a transform, which transforms each block of SAR data to a corresponding block of transform coefficients;
a quantizer, which quantizes each block of transform coefficient according to a quantization parameter to obtain a corresponding block of quantized transform coefficients;
a demultiplexer configured to produce sets of blocks of quantized transform coefficients;
an arithmetic encoder configured to encode the blocks in each set of blocks of the quantized transform coefficients in parallel and according to a probability model to produce an intermediate bitstream for each set of blocks of quantized transform coefficients, where the encoding of the quantized transform coefficients of one block is independent of the quantized transform coefficients of a successive block; and
a multiplexer configured to combine the intermediate of bitstreams into a compressed bitstream.

34. The apparatus of claim 33, in which the encoder is a implemented in a single field programmable gate array.

35. The apparatus of claim 33, in which the encoder uses a field programmable gate array for each block of the set of blocks to be encoded in parallel.

36. The apparatus of claim 33, in which the SAR data are demultiplexed and sampled into N streams of blocks, and each stream of blocks is processed by a field programmable array in parallel.

* * * * *